United States Patent [19]
Jenkins, IV

[11] Patent Number: 6,020,757
[45] Date of Patent: Feb. 1, 2000

[54] SLEW RATE SELECTION CIRCUIT FOR A PROGRAMMABLE DEVICE

[75] Inventor: Jesse H. Jenkins, IV, Danville, Calif.

[73] Assignee: Xilinx, Inc., San Jose, Calif.

[21] Appl. No.: 09/047,177

[22] Filed: Mar. 24, 1998

[51] Int. Cl.[7] .............................................. H03K 19/177
[52] U.S. Cl. ................................ 326/39; 326/37; 326/82; 326/16
[58] Field of Search .......................... 326/37, 82, 39–41, 326/16; 714/724, 725; 327/170

[56] References Cited

U.S. PATENT DOCUMENTS

| | | | |
|---|---|---|---|
| 5,017,813 | 5/1991 | Galbraith et al. | 326/82 |
| 5,144,166 | 9/1992 | Camarota et al. | 326/41 |
| 5,331,220 | 7/1994 | Pierce et al. | |
| 5,644,496 | 7/1997 | Agrawal et al. | 326/41 |

OTHER PUBLICATIONS

"The Programmable Logic Data Book", 1996, pp. 4–5 to 4–96, available from Xilinx, Inc., 2100 Logic Drive, San Jose, California 95124.

IEEE Computer Society, "IEEE Standard Test Access Port and Boundary–Scan Architecture" IEEE Std 1149.1–1990, Copyright 1993 by the Institute of Electrical and Electronics Engineers, Inc. 345 East 47th Street, New York, NY 10017.

*Primary Examiner*—Jon Santamauro
*Attorney, Agent, or Firm*—E. Eric Hoffman; Edel M. Young

[57] ABSTRACT

A system including a programmable logic device (PLD) mounted on a populated printed circuit board, and a configuration processor. The PLD includes a plurality of input/output blocks (IOBs), each having an input buffer and an output buffer. Each output buffer is coupled to an associated adjustable slew rate control circuit and to an adjustable delay line of the PLD. The configuration processor controls each of the slew rate control circuits to provide a first slew rate. The configuration processor also controls the output buffers to be coupled to the adjustable delay line. The configuration processor then controls the adjustable delay line to generate a first test pulse, which is applied to each of the output buffers. Depending on the impedances of the printed circuit board, the first test pulse transmitted from a particular output buffer may be reflected. Reflected test pulses return to the associated input buffers and are recorded. The configuration processor determines which IOBs received reflected test pulses, and which have not. The configuration processor adjusts the slew rate in the IOBs receiving a reflected test pulse, and repeats the test until there are no reflected test pulses.

5 Claims, 5 Drawing Sheets

SLEW RATE SELECTION CIRCUIT FOR A PROGRAMMABLE DEVICE

BACKGROUND OF THE INVENTION

1. FIELD OF THE INVENTION

The present invention relates to a circuit for selecting the slew rates of output buffers in an integrated circuit device. More specifically, the present invention relates to a circuit for automatically selecting the slew rates of output buffers in a programmable logic device attached to a populated printed circuit board, such that the output buffers experience a selected amount of signal reflection.

2. RELATED ART

Digital integrated circuits (ICs) are typically mounted on a printed circuit board, thereby enabling these ICs to be coupled to other integrated circuits, which are also mounted on the printed circuit board. When the digital ICs drive signals out onto the printed circuit board, signal reflections may occur as a result of the impedances of the printed circuit board traces and/or the impedances of other ICs mounted on the printed circuit board. In general, signal reflection occurs when an output signal is driven from a source pin onto a signal path having a relatively low impedance. The low impedance results in the output signal reflecting from the intended destination back to the source pin. If the source pin is an input/output (I/O) pin which receives input signals in addition to providing output signals, the reflected signal may be erroneously interpreted to be a valid input signal.

Early determination of signal reflections on a printed circuit board is critical to successfully debug today's high-speed circuits. Finding unwanted signal reflections is one of the single most difficult tasks to accomplish and frequently results in printed circuit board re-design to eliminate undesired signal reflections.

Time domain reflectometry (TDR) is a conventional technique used to determine passive impedance by using voltage pulses and timing measurements (similar to the manner in which radar devices determine distance). Printed circuit board manufacturers often use TDR to determine the impedance of printed circuit board traces. System designers typically use this impedance information to determine the time delay of signals that are driven onto the printed circuit board. When known, this impedance information helps to determine signal behavior on the printed circuit board, and enables the signal behavior to be improved if necessary. However, the impedances of the printed circuit board traces are measured before there are any devices mounted on the printed circuit board. The presence of devices mounted on the printed circuit board can change the effective impedances of the printed circuit board traces. Sophisticated circuit simulators have been used to model the behavior of devices attached to printed circuit boards with well-known circuit parameters. However, this modeling is difficult and frequently inaccurate.

It would therefore be desirable to have a system which determines the presence of signal reflections on a populated printed circuit board, and automatically eliminates or adjusts detected signal reflections.

SUMMARY

Accordingly, the present invention provides a system which includes a programmable logic device mounted on a populated printed circuit board, and a configuration processor. The programmable logic device includes a plurality of input/output blocks (IOBs), each having an input buffer and an output buffer. Each of the output buffers has an adjustable slew rate control circuit which is programmable to control the slew rate of the associated output buffer. Each of the input buffers can be selectively coupled to an asynchronous latch. Each of the output buffers can be selectively coupled to an adjustable delay line in the programmable logic device. The adjustable delay line is capable of generating digital pulses of different widths.

The configuration processor controls the programmable logic device to select the final slew rates for the various output buffers. The final slew rates are usually selected such that reflected signals are eliminated or minimized. The configuration processor controls each of the slew rate control circuits to provide a first slew rate. In one embodiment, the first slew rate is the fastest selectable slew rate. The configuration processor further controls the programmable logic device to couple each of the input buffers to its associated asynchronous latch, and each of the output buffers to the adjustable delay line. The configuration processor then controls the adjustable delay line to generate a first digital test pulse having a first width. In one embodiment, the first test pulse has a maximum width.

The first test pulse is applied to each of the output buffers, such that the test pulse is transmitted from each output buffer to the printed circuit board. The first test pulse can be applied to the output buffers simultaneously or sequentially. Depending on the impedances of the printed circuit board, the first test pulse transmitted from a particular output buffer may be reflected, thereby resulting in a reflected test pulse. The reflected test pulse returns to the associated input buffer. If the reflected test pulse has a sufficient magnitude, the input buffer transmits a signal to the associated asynchronous latch. In response, the asynchronous latch stores a value indicating the presence of the reflected test pulse.

By monitoring the asynchronous latches, the configuration processor determines which IOBs received a reflected test pulse, and which IOBs did not receive a reflected test pulse. In one embodiment, the contents of the asynchronous latches are transferred to JTAG boundary scan registers associated with the IOBs, and then shifted from these JTAG registers out of the programmable logic device. In response, the configuration processor adjusts the slew rate of the output signal from each IOB that received a reflected test pulse. In one embodiment in which it is desired to have no reflection, the slew rate is adjusted by selecting a slower slew rate. The first test pulse is again applied to the subset of the output buffers having the adjusted slew rates. Again, the associated input buffers and asynchronous latches detect and record any reflected test pulses.

This process is continued until there are no reflected test pulses, or until all the possible slew rates have been tested. If all of the slew rates have been tested, and there are still reflected test pulses, then the first test pulse can be replaced with a second test pulse having a different pulse width. In one embodiment, the second test pulse has a smaller width than the first test pulse. The slew rate testing then proceeds using the second test pulse and the various slew rates.

When no reflected test pulses are detected, the configuration processor transfers the final slew rates from the slew rate control circuits to associated JTAG registers of the programmable logic device. The final slew rates are shifted from the JTAG registers to the configuration processor. During the normal configuration of the programmable logic device, the configuration processor programs the slew rate control circuits with the final slew rates, thereby optimizing performance of the programmable logic device.

The present invention enables the automatic detection and elimination of reflected signals in a programmable logic device which has been mounted on a populated printed circuit board. The invention also enbles the adjustment of reflection of signals where it is desirable to have a certain amount of reflection. Advantageously, the present invention reuses standard circuitry which is already present on the programmable logic device, including the adjustable delay line and the JTAG registers.

The present invention will be more fully understood in view of the following description and drawings.

DETAILED DESCRIPTION

Figure 1:
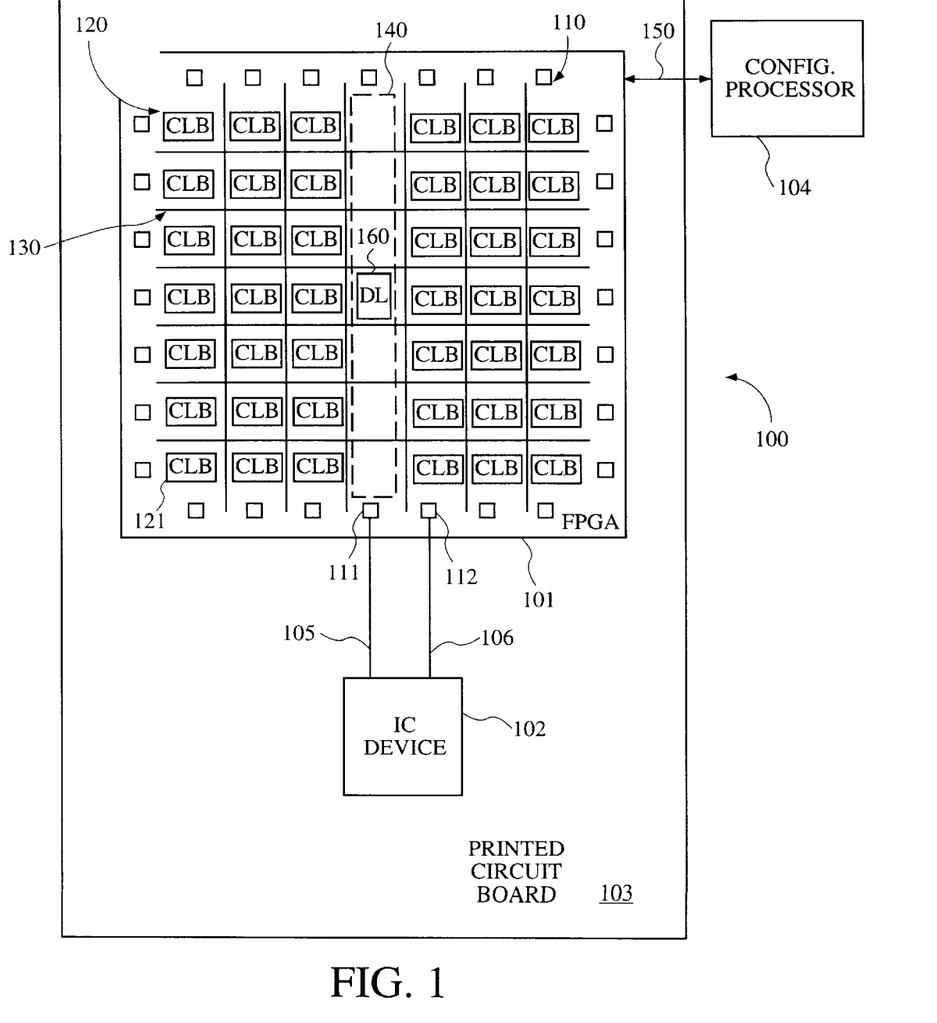
FIG. 1 is a circuit diagram of a system in accordance with one embodiment of the present invention.

FIG. 1 is a circuit diagram of a system 100 in accordance with one embodiment of the present invention. System 100 includes FPGA 101, integrated circuit (IC) device 102, printed circuit board 103, and configuration processor 104. Both FPGA 101 and IC device 102 are mounted on printed circuit board 103. Printed circuit board 103 is, for example, a conventional multi-layer board having multiple insulating layers and conductive paths. As described in more detail below, printed circuit board traces 105 and 106 couple FPGA 101 and IC device 102. Although only two traces are illustrated, printed circuit board 103 typically includes many more traces. In addition, other devices can be mounted on printed circuit board 103. Although configuration processor 104 is shown as being located off printed circuit board 103, in other embodiments, configuration processor 104 is located on printed circuit board 103. It is noted that the strategy engine (the software that implements the flow diagram of FIG. 4, discussed below) is located outside of FPGA 101. The strategy engine is used infrequently, and may be implemented by software sending commands through the JTAG port (not shown) of FPGA 101, thereby directing the distribution of pulses and the collection of latch responses. The control or strategy logic can reside off of printed circuit board 103, in a separate computer which is attached to FPGA 101 by a JTAG cable.

FPGA 101 includes a plurality of programmable input/output blocks (IOBs) 110, such as IOBs 111 and 112, located around the perimeter of FPGA 101. FPGA 101 further includes a centrally located array 120 of configurable logic blocks (CLBs), such as CLB 121. Programmable interconnect resources 130 extend between the CLBs of CLB array 120 and IOBs 110. In general, the CLBs of CLB array 120 are configured by configuration processor 104 to provide the functional elements of a logic circuit. The IOBs 110 are also configured by configuration processor 104 to provide an interface between external circuits (e.g., IC device 102) and the logic circuit implemented by the CLB array 120. The programmable interconnect resources 130 are also configured by configuration processor 104 to provide routing paths to connect the IOBs 110 and CLBs 120 into the desired networks. Both CLB array 120 and programmable interconnect resources 130 are conventional elements which are described in more detail in The Programmable Logic Data Book, (1996) pp. 4-5 to 4-96, available from Xilinx, Inc., 2100 Logic Drive, San Jose, Calif., which are hereby incorporated by reference.

Custom configuration of FPGA 101 is achieved by programming internal static configuration memory cells that determine the logic functions and interconnections of IOBs 110, CLBs 120 and programmable interconnect resources 130. The custom configuration of FPGA 101 is performed under the control of external configuration processor 104 through interface 150. Configuration processor 104 and interface 150 are largely conventional, with novel features of these elements being described below. Some of the resources required to configure FPGA 101 are located in centrally located region 140 of FPGA 101. This centrally located region 140 is hereinafter referred to as center strip 140. Several circuits of FPGA 101 are located in center strip 140. One such circuit is a variable pulse generator, or adjustable delay line 160.

Figure 2:
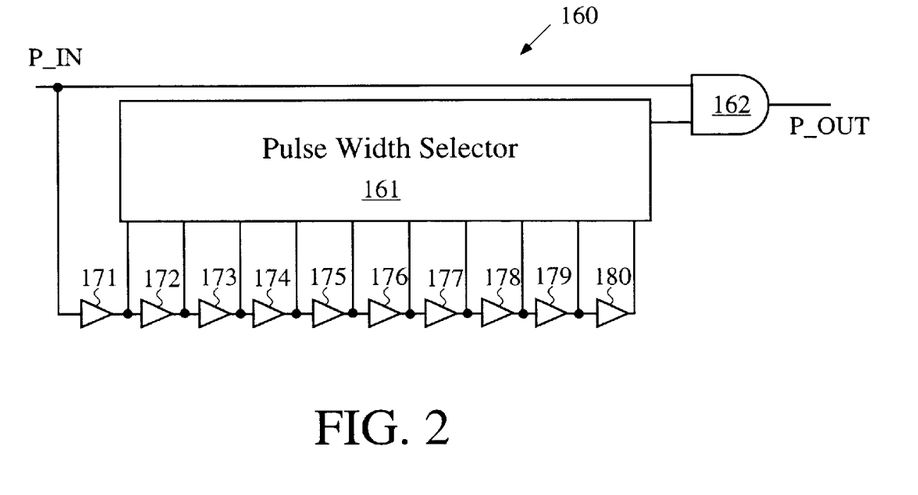
FIG. 2 is a circuit diagram of an adjustable delay line used in one embodiment of the invention.

FIG. 2 is a circuit diagram of delay line 160 of FIG. 1 in accordance with one embodiment of the invention. Delay line 160 includes pulse width selector 161, AND gate 162 and amplifiers 171–180. The first input terminal of AND gate 162 is coupled to receive an input pulse P_IN. Amplifiers 171–180 are connected in series, with the input terminal of amplifier 171 being coupled to receive the P_IN input pulse. The output terminals of amplifiers 171–180 are connected to pulse width selector 161. Pulse width selector 161 selectively couples the output terminal of one of these amplifiers 171–180 to the second input terminal of AND gate 162. Each of amplifiers 171–180 typically exhibits a base delay B_D in transmitting the P_IN input pulse. If pulse width selector 161 connects N series amplifiers to the second input terminal of AND gate 162, then the P_IN input pulse is delayed by N times B_D before being applied to the second input terminal of AND gate 162. Thus, by selecting N, the width of the output pulse P_OUT provided by AND gate 162 can be controlled. During normal operation of FPGA 101, delay line 160 is used as part of a digital phase lock loop, which in turn is used to adjust clock skew.

As described in more detail below, configuration processor 104 (FIG. 1) is programmed to perform an automatic slew rate test on FPGA 101 after FPGA 101 is powered on and before FPGA 101 is configured. During this slew rate test, delay line 160 is controlled to sequentially transmit pulses to each of the IOBs. After transmitting the pulses, the IOBs monitor their associated traces for a reflected signal. If a reflected signal is detected at a particular IOB, the slew rate of the IOB is modified and the test is performed again. This process is continued until the slew rates are selected such that there are no reflected signals. The slew rate selected for each IOB is then transmitted to the configuration processor 104. The configuration processor then configures the IOBs to have the selected slew rates during the configuration of FPGA 101.

Figure 3:
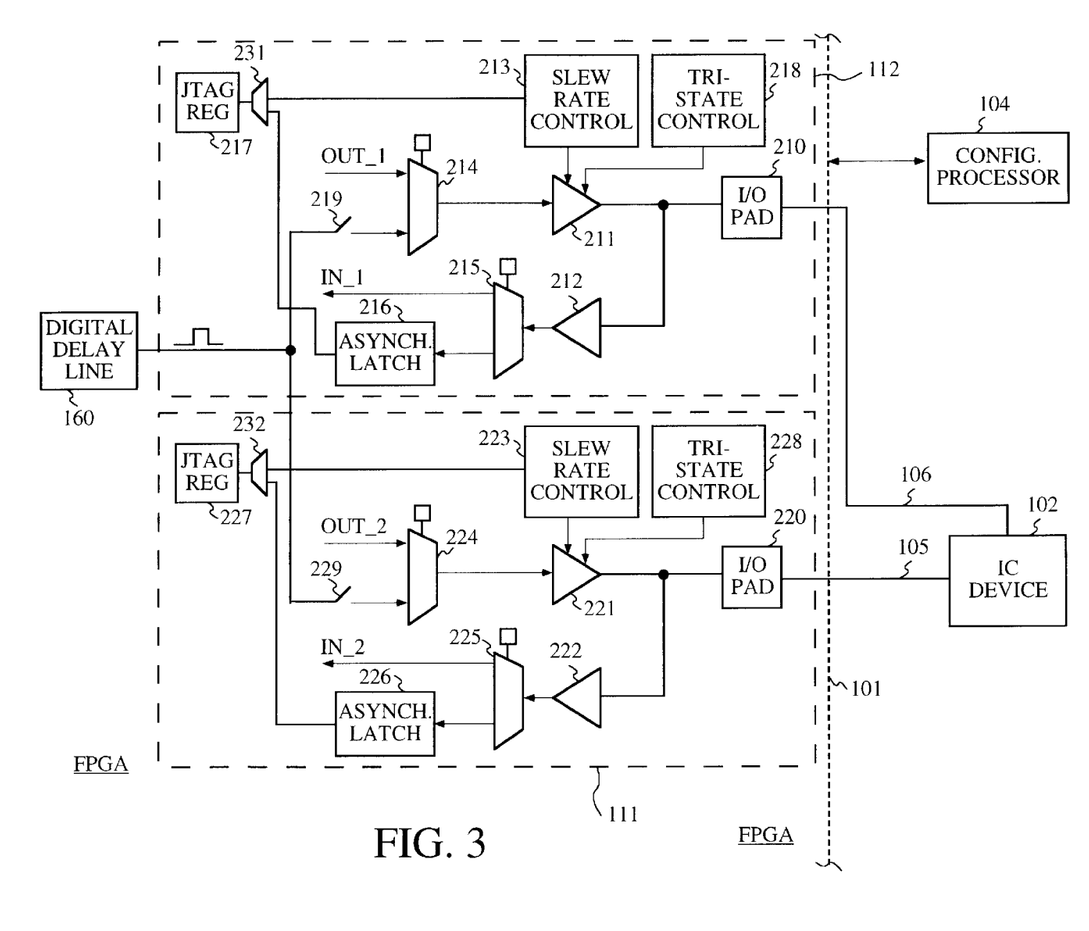
FIG. 3 is a circuit diagram illustrating input/output blocks of the system of FIG. 1 in more detail.

FIG. 3 is a circuit diagram illustrating IOBs 111–112 in more detail. IOB 111 includes I/O pad 210, tri-state output buffer 211, input buffer 212, slew rate control circuit 213, multiplexer 214, de-multiplexer 215, asynchronous latch 216, JTAG register 217, tri-state control circuit 218, switch 219 and multiplexer 231. Similarly, IOB 112 includes I/O pad 220, tri-state output buffer 221, input buffer 222, slew rate control circuit 223, multiplexer 224, de-multiplexer 225, asynchronous latch 226, JTAG register 227, tri-state control circuit 228, switch 229 and multiplexer 232. Although only IOBs 111 and 112 are described in detail, it is understood that all of the IOBs of FPGA 101 have such circuitry.

The connections of IOB 112 will now be described. Because the various elements of IOB 111 are connected in the same manner as the elements of IOB 112, the connections of IOB 111 will not be described in detail. IOB 112 includes an I/O pad 210 which is connected to trace 106 of printed circuit board 103 in a manner well known in the art. The output terminal of output buffer 211 is connected to I/O pad 210. Output buffer 211 is a tri-state buffer which is controlled by slew rate control circuit 213 and tri-state control circuit 218. Tri-state control circuit 218 controls output buffer 211 to be in an enabled state (in which case output buffer 211 provides a logic high signal or a logic low signal) or a high-impedance state.

Slew rate control circuit 213 controls the rate at which the output signals provided by output buffer 211 change value. Slew rate control circuit 213 is programmable to provide a plurality of pre-determined slew rates. Configuration memory cells (not shown) associated with slew rate control circuit 213 are programmed to store configuration data values which define the slew rate of slew rate control circuit 213. During the slew rate test, configuration processor 104 programs these configuration memory cells to store the desired configuration data values, thereby causing slew rate control circuit 213 to provide the desired slew rate. Adjustable slew rate control circuit 213 is a conventional element which is described in more detail by Pierce et al. in U.S. Pat. No. 5,331,220, which is hereby incorporated by reference.

Slew rate control circuit 213 is also coupled to JTAG register 217 through multiplexer 231. JTAG register 217 is a conventional register which is typically included in IOB 112 to implement JTAG testing. JTAG register 217 is described in more detail in The Programmable Logic Data Book, (1996) pp. 4-5 to 4-96, available from Xilinx. As described in more detail below, during the slew rate test, configuration processor 104 causes the configuration data values which define the slew rate control circuit 213 to be written to JTAG register 217.

The input terminal of output buffer 211 is coupled to multiplexer 214. Multiplexer 214, in turn, is coupled to receive an output signal OUT_1 from other conventional circuitry within IOB 112 (not shown). The circuitry which provides the output signal OUT_1 can include, for example, a connection to the programmable interconnect resources 130 (FIG. 1), a connection to the programmable interconnect resources 130 through an inverter, or a connection to the programmable interconnect resources through a flip flop. This circuitry is not illustrated in FIG. 2 for purposes of clarity. However, this conventional circuitry is described in more detail in The Programmable Logic Data Book, (1996) pp. 4-5 to 4-96, available from Xilinx.

Multiplexer 214 is also coupled to delay line 160 through switch 219. During the slew rate test, configuration processor 104 controls multiplexer 214 to couple the digital delay line 160 to output buffer 211. As described in more detail below, configuration processor 104 also controls switch 219.

The input terminal of input buffer 212 is coupled to I/O pad 210 (and to the output terminal of output buffer 211). The output terminal of input buffer 212 is coupled to de-multiplexer 215. De-multiplexer 215 can be controlled to route the signal provided by input buffer 212 as an input signal IN_1 to conventional circuitry within IOB 112 (not shown). The conventional circuitry which receives the input signal IN_1 can include, for example, a connection to programmable interconnect resources 130, a connection to programmable interconnect resources 130 through a flip flop, or a connection to programmable interconnect resources 130 through a delay circuit and the flip flop. This circuitry is not illustrated in FIG. 2 for purposes of clarity. However, this conventional circuitry is described in more detail in The Programmable Logic Data Book, (1996) pp. 4-5 to 4-96, available from Xilinx.

De-multiplexer 215 is also coupled to asynchronous latch 216. During the slew rate test, configuration processor 104 controls de-multiplexer 215 to couple input buffer 212 to asynchronous latch 216. Asynchronous latch 216 is also coupled to JTAG register 217 through multiplexer 231. As described in more detail below, during the slew rate test, configuration processor 104 controls multiplexer 231 to cause the contents of asynchronous latch 216 to be transferred to JTAG register 217.

Figure 4:
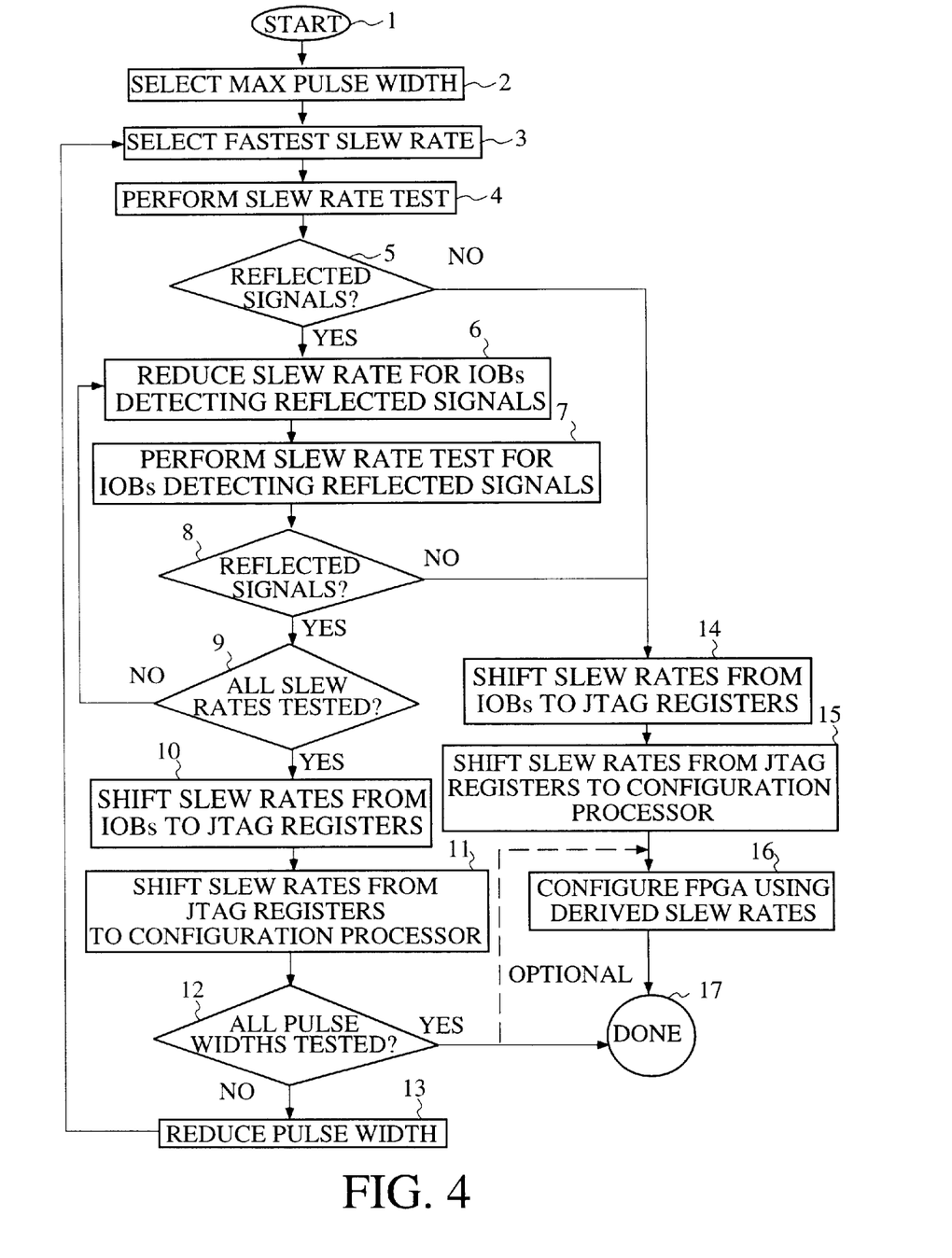
FIG. 4 is a flow diagram illustrating an automatic slew rate test performed in accordance with one embodiment of the present invention.

FIG. 4 is a flow diagram illustrating the automatic slew rate test performed in accordance with one embodiment of the present invention. During the initialization of system 100 (i.e., power up), configuration processor 104 starts the slew rate test (Step 1) by assuming control of delay line 160, slew rate control circuits 213 and 223, multiplexers 214 and 224, de-multiplexers 215 and 225, tri-state control circuits 218 and 228, and switches 219 and 229. Configuration processor 104 controls multiplexers 214 and 224 to couple delay line 160 to output buffers 211 and 221. Configuration processor 104 further controls de-multiplexers 215 and 225 such that input buffers 212 and 222 are coupled to asynchronous latches 216 and 226, respectively. Tri-state control circuits 218 and 228 are controlled to enable output buffers 211 and 221, respectively.

After IOBs 111 and 112 have been configured as described above, configuration controller 104 causes delay line 160 to select a digital test pulse having a predetermined width. In the described example, the selected pulse width corresponds with the maximum pulse width that can be generated by delay line 160 (Step 2). In general, the maximum pulse width is selected by using pulse width selector 161 to couple the output of amplifier 171 to the second input terminal of AND gate 162 (FIG. 2). The maximum pulse width is selected because this pulse width is most likely to cause a signal reflection.

Slew rate control circuits 213 and 223 (FIG. 3) are controlled to select a default slew rate within output buffers 211 and 221, respectively (Step 3). In the described embodiment, the default slew rate is the fastest possible slew rate. The other IOBs of FPGA 101 are controlled in a similar manner.

Configuration controller 104 then begins the slew rate test (Step 4) by closing switch 219 and opening switch 229 (and opening the corresponding switches in the remaining IOBs), such that output buffer 211 is the only output buffer which receives the test pulse provided by delay line 160. The test pulse is transmitted through output buffer 211 at the slew rate selected by slew rate control circuit 213. The test pulse is thereby transmitted to I/O pad 210, trace 106 and IC device 102. Immediately after the test pulse has been transmitted, configuration controller 104 causes tri-state control circuit 218 to disable output buffer 211. Configuration controller 104 resets asynchronous latch 216 after output buffer 211 has been disabled.

In another embodiment, latch 216 is cleared simultaneously with disabling output buffer 211, so that there is no possibility that a fast reflection will arrive at latch 216 before latch 216 is cleared, and thus be missed.

In yet another embodiment, input buffer 212 is a tristate buffer and is controlled by the complement of the tristate control signal from tristate control circuit 218. In this embodiment, latch 216 can be cleared at any time from before output buffer 211 is enabled (thus transmitting the output pulse) until output buffer 211 is disabled and input buffer 212 is enabled.

The impedance presented by trace 106 and IC device 102 may cause the test pulse to be reflected back to I/O pad 210 and input buffer 212. If the reflected test pulse has a magnitude sufficient to activate input buffer 212, then input buffer 212 transmits the reflected test pulse to asynchronous latch 216. In response, asynchronous latch 216 enters a state which is representative of having received the reflected test pulse. Latch 216 is asynchronous because the timing of the reflected test pulse is not known.

After IOB 112 has been tested, configuration processor 104 opens switch 219 and closes switch 229. Configuration processor 104 then causes delay line 160 to generate a second maximum-width test pulse, which is provided to output buffer 221 through switch 229 and multiplexer 224. The slew rate test of IOB 111 continues as described above in connection with IOB 112. If the second test pulse is reflected with sufficient magnitude, asynchronous latch 226 will enter a state representative of this occurrence.

The slew rate test continues in this manner, with each IOB of FPGA 101 receiving a test pulse, and storing an appropriate value in a corresponding asynchronous latch if there is a reflected digital pulse of a predetermined magnitude.

After pulsing all of the IOBs of FPGA 101, configuration processor 104 reads the state of each of the asynchronous latches, thereby determining if any of the IOBs received a reflected test pulse (Step 5). The contents of the asynchronous latches are routed into the JTAG registers through the associated multiplexers under the control of configuration processor 104. For example, configuration processor 104 controls multiplexer 231 to transfer the contents of asynchronous latch 216 to JTAG register 217. The contents of the JTAG registers are then shifted out of the JTAG registers to the configuration processor 104 in the manner described below in connection with FIG. 5.

If none of the asynchronous latches detected a reflected test pulse, then configuration processor 104 causes each of the slew rate control circuits to transmit signals representative of their current slew rates to their associated JTAG registers (Step 14). For example, configuration processor 104 controls multiplexers 231 and 323 to couple slew rate control circuits 213 and 223 to JTAG registers 217 and 227, respectively, thereby transferring the fastest slew rate to these JTAG registers 217 and 227. If there are more than two selectable slew rates, the JTAG registers are expanded to be able to store more than one bit. For example, if there are four selectable slew rates, each JTAG register must be able to store at least two bits to represent each of these four slew rates. The contents of the JTAG registers are then shifted out of the JTAG registers to the configuration processor 104 in the manner described below in connection with FIG. 5.

Figure 5:
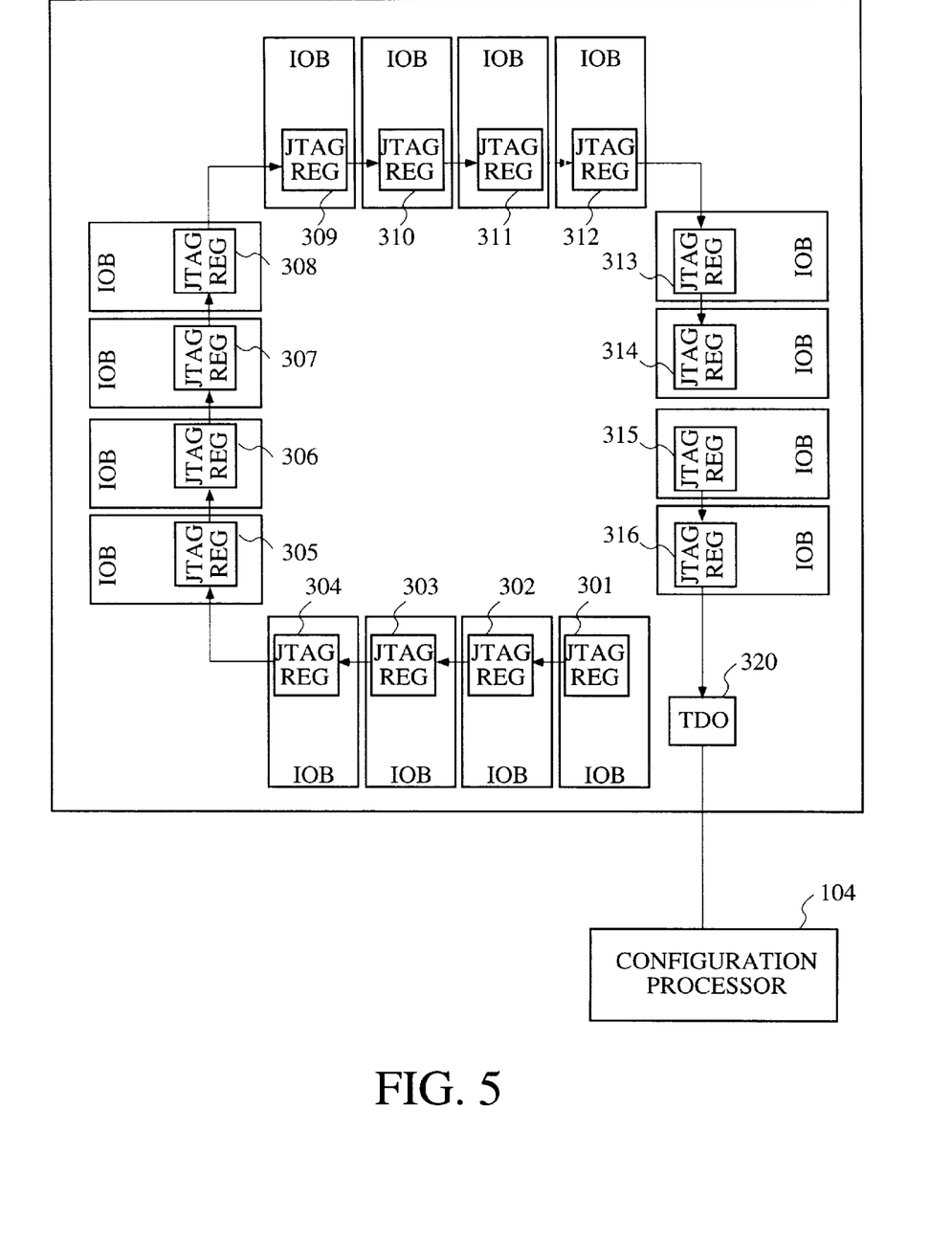
FIG. 5 is a block diagram illustrating a plurality of JTAG registers in accordance with one embodiment of the invention.

Configuration processor 104 accesses the JTAG registers as follows. FIG. 5 is a block diagram illustrating a plurality of JTAG registers 301–316 in accordance with one embodiment of the invention. JTAG registers 301–316 are connected in a series chain in accordance with the IEEE Standard Test Access Port and Boundary-Scan Architecture, IEEE Std. 1149.1-1990 (including IEEE Std. 1149.1a-193).

The end of the chain of JTAG registers is connected to a dedicated JTAG test pin 320, typically designated TDO (test data out). The binary values representing the final slew rates (or the contents of the asynchronous latches) are sequentially shifted along the chain to TDO pin 320 under the control of configuration processor 104. Configuration processor 104 receives the final slew rate values (or the contents of the asynchronous latches) from TDO pin 320 (Step 15). Note that there are three other mandatory JTAG signal pins (TES, TCK and TDI) which are not illustrated in FIG. 5 for purposes of clarity.

Configuration processor 104 uses the received final slew rates to configure the slew rate control circuits during the configuration of FPGA 101 (Step 16). In the current example, all of the slew rate control circuits would be configured to have the fastest slew rate. At this point, the slew rate test is done (Step 17).

Returning to Step 5 in the flow diagram of FIG. 4, if any of the asynchronous latches detected a reflected test pulse, then configuration processor 104 adjusts the slew rate of each of the IOBs associated with these asynchronous latches. In the described embodiment, the slew rate for each of these IOBs is reduced to the next slower selectable slew rate (Step 6). The slew rate test is then repeated (Step 7) for these IOBs in the manner described above in connection with Step 4. Note that in Step 7 the slew rate test is not repeated for IOBs that did not detect a reflected test pulse during the slew rate test of Step 4.

If no reflected test pulses are detected during the slew rate test of Step 7, then the current slew rate settings are properly selected to prevent signal reflections, and processing proceeds to Steps 14–17. In this case, however, it is possible that some of the slew rate control circuits are set at the fastest slew rate, while other slew rate control circuits are set at the next slower slew rate. This slew rate information is transmitted to the JTAG registers (Step 14) and then to configuration processor 104 (Step 15), which in turn, uses this slew rate information to configure the slew rate control circuits with the appropriate slew rates (Step 16).

If the slew rate test of Step 7 still results in reflected test pulses (Step 8), configuration processor 104 determines whether or not all possible slew rates have been tested (Step 9). If all possible slew rates have not been tested, processing returns to Step 6, and processing is repeated for the next slower slew rate. However, if all possible slew rates have been tested (and there are still reflected test pulses), processing proceeds to Step 10, where the current slew rates are shifted from the IOBs to the JTAG registers (Step 10), and are then shifted from the JTAG registers to configuration processor 104 (Step 11). Steps 10 and 11 are performed in the same manner previously described for Steps 14 and 15, respectively. Configuration processor 104 processes the received slew rate information to determine which IOBs are receiving the reflected test pulses.

After all of the possible slew rates have been tested at the maximum width test pulse, configuration processor 104 controls delay line 160 to adjust the width of the test pulse (Step 13). Note that the width of the test pulse is only adjusted if all of the possible test pulse widths have not already been tested in the slew rate test (Step 12). In the described embodiment, the width of the test pulse is incrementally reduced by connecting another amplifier within delay chain 160 (FIG. 2). For example, to reduce the width of the maximum width test pulse, configuration processor 104 controls the pulse width selector 161 to route the output of amplifier 172 to the second input terminal of AND gate 162 (FIG. 2). After the pulse width has been reduced, processing returns to Step 3, where the above-described process is repeated. If all slew rates and pulse widths have been tested (and there are still reflected test pulses), processing proceeds from Step 12 to Step 17. Alternatively, processing can proceed from Step 12 to Step 16, with configuration processor 104 configuring FPGA 101 in the best possible manner in response to the results of the slew rate testing. This alternative step is shown in dashed lines in FIG. 4. Also, alternatively, the configuration processor can generate a message usable for modifying the board into which FPGA 101 is mounted. In the foregoing manner, the slew rate control circuits of FPGA 101 are configured to eliminate (or minimize) reflected signals. Because the slew rate tests are performed while FPGA 101 is mounted on a populated printed circuit board 103, the results of the slew rate tests are inherently accurate.

Advantageously, slew rate testing in accordance with the present invention reuses circuitry which has other functions within FPGA 101. More specifically, the present invention reuses the JTAG registers and delay line 160, which are used for other purposes during normal operation of FPGA 101.

It should be noted that IC device 102 (and all similar devices mounted on printed circuit board 103) should be designed to not deliver extraneous pulses during the slew rate testing. This is necessary because it is possible for some ICs, like clock circuits, to come up delivering their own pulses. In this case it may be necessary to inform configuration processor 104 of such ICs, and to take action to disregard pulse activity on uncontrolled pins.

It is also noted that some bus standards rely on signal reflections. For example, the Peripheral Component Interconnect (PCI) specification stipulates that bus points are unterminated, and relies on reflected wave switching. In this case, weak pulses are delivered to the bus and the reflection is targeted to constructively add so the reflected signal reaches its correct value due to the reflection adding to the original signal. For these buses, the above-described slew rate testing is modified to look for the absence of reflected signals and modify the slew rate until reflected signals occur.

Although the invention has been described in connection with several embodiments, it is understood that this invention is not limited to the embodiments disclosed, but is capable of various modifications which would be apparent to a person skilled in the art. For example, although the described slew rate test sequentially tests the IOBs, it is understood that in another embodiment, many or all IOBs can be tested simultaneously. Moreover, although the present invention has been described in connection with an FPGA, it is understood that the invention is applicable to other programmable devices, such as complex programmable logic devices (CPLDs). Thus, the invention is limited only by the following claims.

What is claimed is:

1. A programmable device comprising:

a plurality of input/output blocks (IOBs), each having an input buffer and an output buffer;

an adjustable slew rate control circuit coupled to each output buffer, wherein each adjustable slew rate control circuit is programmable to control the slew rate of an associated output buffer;

an asynchronous latch coupled to each input buffer; and a variable pulse generator coupled to each output buffer.

2. The programmable device of claim 1, wherein the variable pulse generator comprises a delay line.

3. The programmable device of claim 1, wherein each output buffer is a tri-state buffer.

4. The programmable device of claim 1, further comprising a plurality of switches, wherein each switch is located between the variable pulse generator to an associated output buffer.

5. The programmable device of claim 1, wherein each slew rate control circuit is coupled to a JTAG register, such that information identifying the current slew rate of the slew rate control circuit can be transferred from the slew rate control circuit to the JTAG register.

* * * * *